United States Patent
Shingu et al.

(10) Patent No.: US 10,166,580 B2
(45) Date of Patent: Jan. 1, 2019

(54) ALUMINUM FOIL, ELECTRONIC DEVICE, ROLL-TO-ROLL ALUMINUM FOIL, AND METHOD OF PRODUCING ALUMINUM FOIL

(71) Applicant: TOYO ALUMINIUM KABUSHIKI KAISHA, Osaka-shi, Osaka (JP)

(72) Inventors: Akira Shingu, Osaka (JP); Mitsunari Ooyagi, Osaka (JP)

(73) Assignee: TOYO ALUMINIUM KABUSHIKI KAISHA, Osaka-Shi (JP)

( * ) Notice: Subject to any disclaimer, the term of this patent is extended or adjusted under 35 U.S.C. 154(b) by 0 days.

(21) Appl. No.: 15/544,690

(22) PCT Filed: Jan. 22, 2016

(86) PCT No.: PCT/JP2016/051854
§ 371 (c)(1),
(2) Date: Jul. 19, 2017

(87) PCT Pub. No.: WO2016/125608
PCT Pub. Date: Aug. 11, 2016

(65) Prior Publication Data
US 2018/0281036 A1 Oct. 4, 2018

(30) Foreign Application Priority Data
Feb. 3, 2015 (JP) .................... 2015-019415

(51) Int. Cl.
*H01L 23/12* (2006.01)
*H01L 21/00* (2006.01)
(Continued)

(52) U.S. Cl.
CPC .............. *B21B 1/40* (2013.01); *C22C 21/00* (2013.01); *H01B 1/023* (2013.01);
(Continued)

(58) Field of Classification Search
CPC . H01L 2924/01029; H01L 2924/01079; H01L 2924/01078; H01L 2924/14;
(Continued)

(56) References Cited

U.S. PATENT DOCUMENTS

| 3,556,874 A | 1/1971 | McClain | |
|---|---|---|---|
| 2009/0020858 A1* | 1/2009 | Kozaka | H01J 11/10 257/667 |

(Continued)

FOREIGN PATENT DOCUMENTS

| CN | 102234750 A | 11/2011 |
|---|---|---|
| CN | 103249857 A | 8/2013 |

(Continued)

OTHER PUBLICATIONS

Written Opinion of the International Searching Authority for PCT/JP2016/051854 (PCT/ISA/237) dated Feb. 16, 2016.
(Continued)

*Primary Examiner* — Thinh T Nguyen
(74) *Attorney, Agent, or Firm* — Birch, Stewart, Kolasch & Birch, LLP

(57) ABSTRACT

An aluminum foil includes a first main surface and a second main surface located opposite to the first main surface. In at least one of the first main surface and the second main surface, a surface roughness Ra is not more than 10 nm, a surface roughness Rz is not more than 40 nm in each of a rolling direction and a direction perpendicular to the rolling direction, and the number of peak counts is not less than 10 when a reference length is 40 μm, the number of peak counts being determined from a roughness curve in at least one of the rolling direction and the direction perpendicular to the rolling direction.

7 Claims, 5 Drawing Sheets

(51) Int. Cl.
  *B21B 1/40* (2006.01)
  *C22C 21/00* (2006.01)
  *H01L 31/0224* (2006.01)
  *H01L 51/52* (2006.01)
  *H01L 51/00* (2006.01)
  *H01B 1/02* (2006.01)
  *H01B 13/00* (2006.01)
  *H01L 31/0392* (2006.01)
  *B21B 3/00* (2006.01)
  *H01L 23/00* (2006.01)

(52) U.S. Cl.
  CPC .. *H01B 13/0036* (2013.01); *H01L 31/022425* (2013.01); *H01L 31/0392* (2013.01); *H01L 51/0021* (2013.01); *H01L 51/5206* (2013.01); *H01L 51/5221* (2013.01); *B21B 2003/001* (2013.01); *H01L 24/50* (2013.01); *H01L 2251/301* (2013.01); *H01L 2924/01029* (2013.01); *H01L 2924/01079* (2013.01)

(58) Field of Classification Search
  CPC ............... H01L 24/50; H01L 2924/00; H01L 2924/181; H01L 51/5206; H01L 51/0021; H01L 31/022425; H01L 31/0392; Y02E 10/50
  USPC ......... 257/734, 690, 667, E21.449; 438/119, 438/124, 118, 121
  See application file for complete search history.

(56) References Cited

U.S. PATENT DOCUMENTS

| | | | |
|---|---|---|---|
| 2010/0019370 A1* | 1/2010 | Pressel | B81B 7/02 257/690 |
| 2012/0305071 A1 | 12/2012 | Afseth et al. | |
| 2013/0236734 A1 | 9/2013 | Kobayashi et al. | |
| 2015/0099170 A1 | 4/2015 | Motoi et al. | |
| 2015/0283590 A1 | 10/2015 | Glass et al. | |

FOREIGN PATENT DOCUMENTS

| | | |
|---|---|---|
| CN | 104160536 A | 11/2014 |
| EP | 2328183 A1 | 6/2011 |
| EP | 2712685 A1 | 4/2014 |
| JP | 2002-224710 A | 8/2002 |
| JP | 2004-122184 A | 4/2004 |
| JP | 2004-220907 A | 8/2004 |
| JP | 3907095 B2 | 4/2007 |
| JP | 2012-77130 A | 4/2012 |
| JP | 2013-45788 A | 3/2013 |
| KR | 10-1336255 B1 | 12/2013 |

OTHER PUBLICATIONS

Chinese Office Action and Search Report for Application No. 201680007844.6, dated Jun. 13, 2018, with an English translation of the Office Action.

Extended European Search Report for Application No. 16746439.5, dated Oct. 17, 2018.

* cited by examiner

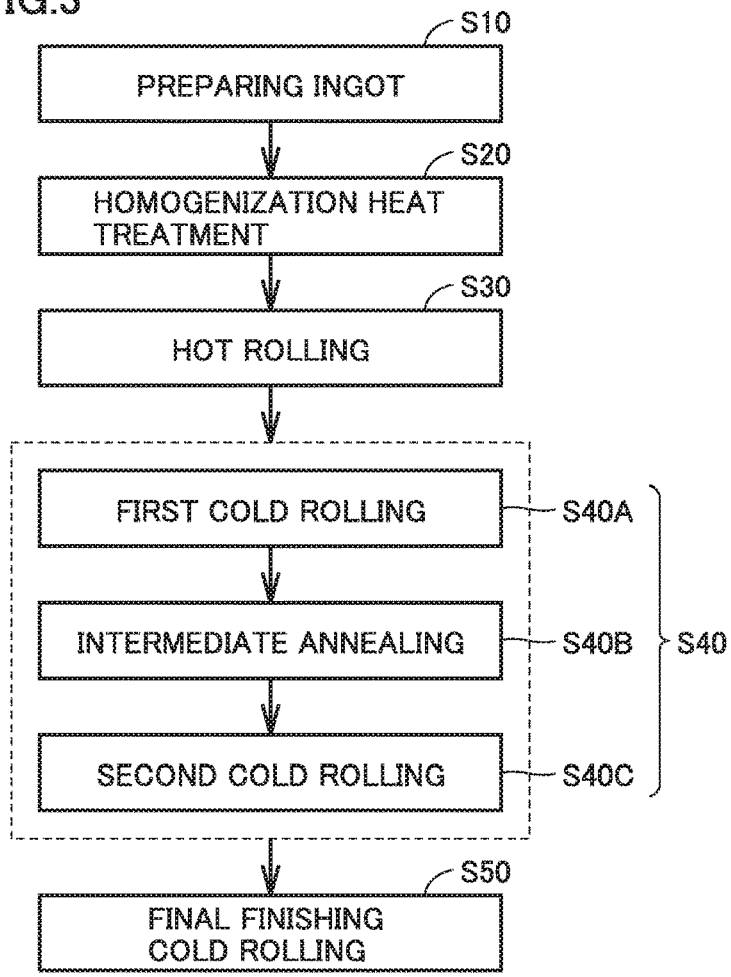
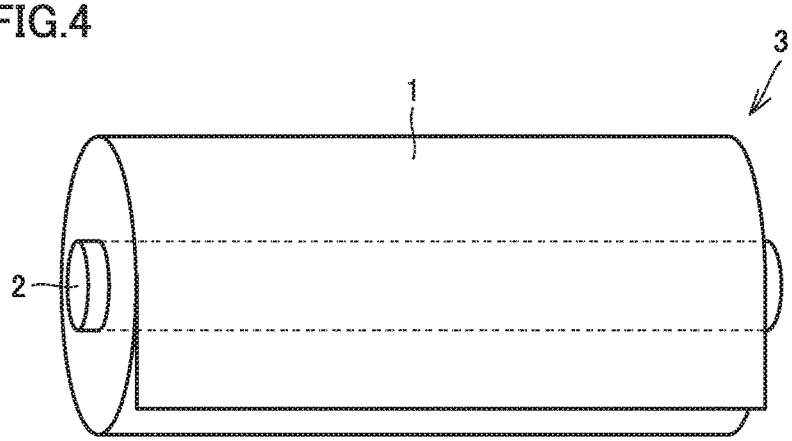

ALUMINUM FOIL, ELECTRONIC DEVICE, ROLL-TO-ROLL ALUMINUM FOIL, AND METHOD OF PRODUCING ALUMINUM FOIL

CROSS REFERENCE TO RELATED APPLICATIONS

This application is the National Phase of PCT International Application No. PCT/JP2016/051854, filed on Jan. 22, 2016, which claims priority under 35 U.S.C. 119(a) to Patent Application No. 2015-019415, filed in Japan on Feb. 3, 2015, all of which are hereby expressly incorporated by reference into the present application.

TECHNICAL FIELD

The present invention relates to an aluminum foil, an electronic device, a roll-to-roll aluminum foil, and a method of producing the aluminum foil. It should be noted that in the present specification, the term "aluminum foil" is intended to include not only a pure aluminum foil but also an aluminum alloy foil.

BACKGROUND ART

In recent years, electronic devices have been required to have reduced thickness, reduced weight, and flexibility due to rapid progress in displays such as a crystal liquid display, an organic EL display, and an electronic paper, as well as an organic solar cell, a secondary battery, a semiconductor, a touch panel, and the like. In view of this, in order to achieve the reduced thickness, reduced weight, and flexibility, it has been considered to use a thin substrate and a thin functional coating layer formed on the substrate in an electronic device.

Moreover, as a method of producing such an electronic device, it has been considered to employ a roll-to-roll process in order to achieve low cost.

Since aluminum (Al), which is light in weight and is excellent in heat resistance, can be a thin and flexible material that can be subjected to the roll-to-roll process when it is in the form of a foil, aluminum has been drawing attention as the substrate of the above-described electronic device or a carrier member used for the roll-to-roll process. It should be noted that regarding the surface smoothness of the aluminum foil, a surface roughness Ra thereof is about 0.04 μm in a measurement based on JIS B0601 (1982) as described in Japanese Patent Laying-Open No. 2013-045788 (Patent Document 1).

CITATION LIST

Patent Document

PTD 1: Japanese Patent Laying-Open No. 2013-045788

SUMMARY OF INVENTION

Technical Problem

However, use of a conventional aluminum foil in the roll-to-roll process leads to a problem such as wrinkling or waviness.

The present invention has been made to solve the foregoing problem. A main object of the present invention is to provide: an aluminum foil in which occurrence of wrinkling or waviness is suppressed when the roll-to-roll process is performed; a method of producing the aluminum foil; an electronic device including the aluminum foil; and a roll-to-roll aluminum foil.

Solution to Problem

In order to solve the above-described problem, as a result of diligent study, the present inventors found that occurrence of wrinkling and waviness in the roll-to-roll process is suppressed in an aluminum foil in which not only surface roughnesses Ra, Rz but also the number of peak counts based on a roughness curve are controlled. Specifically, each of an aluminum foil, a method of producing the aluminum foil, an electronic device, and a roll-to-roll aluminum foil in the present invention has the following features.

An aluminum foil according to the present invention includes a first main surface and a second main surface located opposite to the first main surface. In at least one of the first main surface and the second main surface, a surface roughness Ra is not more than 10 nm, a surface roughness Rz is not more than 40 nm in each of a rolling direction and a direction perpendicular to the rolling direction, the number of peak counts is not less than 10 when a reference length L is 40 μm, and the number of peak counts being determined from a roughness curve in at least one of the rolling direction and the direction perpendicular to the rolling direction.

Preferably in the aluminum foil, a static friction coefficient is not more than 1.0 in the at least one of the first main surface and the second main surface.

Preferably in the aluminum foil, a dynamic friction coefficient is not more than 0.8 in the at least one of the first main surface and the second main surface.

Preferably in the aluminum foil, the aluminum foil has a thickness of not less than 4 μm and not more than 200 μm.

An electronic device according to the present invention includes: the aluminum foil according to the present invention; and a function element formed on the aluminum foil.

A roll-to-roll aluminum foil according to the present invention includes: the aluminum foil according to the present invention; and a core around which the aluminum foil is wound in the form of a roll. The roll-to-roll aluminum foil can be suitably used as a roll-to-roll carrier member.

A method of producing an aluminum foil according to the present invention is a method of producing the aluminum foil according to the present invention. The method includes forming the aluminum foil by performing final finishing cold rolling to a target member at a rolling reduction ratio of not less than 35% using a reduction roll having a surface roughness Ra of not more than 40 nm.

Advantageous Effects of Invention

According to the present invention, there can be provided: an aluminum foil in which occurrence of wrinkling or waviness is suppressed when a roll-to-roll process is performed; an electronic device including the aluminum foil; a roll-to-roll aluminum foil; and a method of producing the aluminum foil.

BRIEF DESCRIPTION OF DRAWINGS

FIG. 3 is a flowchart of a method of producing the aluminum foil according to the present embodiment.

FIG. 4 is a perspective view for illustrating a roll-to-roll aluminum foil according to the present embodiment.

DESCRIPTION OF EMBODIMENTS

Figure 1:
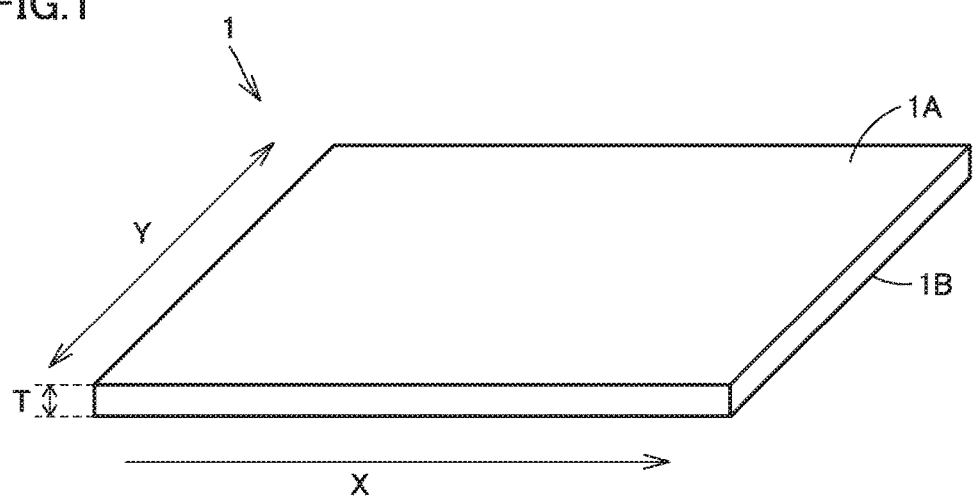
FIG. 1 is a perspective view for illustrating an aluminum foil according to the present embodiment.

The following describes an embodiment according to the present invention with reference to figures. It should be noted that in the below-described figures, the same or corresponding portions are given the same reference characters and are not described repeatedly.

First, as shown in FIG. 1, an aluminum foil 1 according to the present embodiment will be described. In a method of producing an aluminum foil 1, aluminum foil 1 is cold-rolled and has a rolling direction X. Rolling direction X of aluminum foil 1 can be determined based on a roll mark (not shown) formed on aluminum foil L The roll mark is formed on aluminum foil 1 in a direction parallel to rolling direction X as a result of a cold rolling step.

Aluminum foil 1 has a first main surface 1A and a second main surface 1B located opposite to first main surface 1A. Each of first main surface 1A and second main surface 1B has a rectangular shape, for example. One set of opposite sides in the rectangular shape of each of first main surface 1A and second main surface 1B are along rolling direction X. The other set of opposite sides in the rectangular shape of each of first main surface 1A and second main surface 1B is along a perpendicular direction Y.

Here, first main surface 1A and second main surface 1B of aluminum foil 1 refer to surfaces thereof with the largest surface area among surfaces that ban be identified through observation with eyes or through a microscope in an external appearance of aluminum foil 1. Strictly, respective oxide coating films are formed on first main surface 1A and second main surface 1B of aluminum foil 1, and first main surface 1A and second main surface 1B of aluminum foil 1 in the present invention refer to the respective main surfaces of aluminum foil 1 including these oxide coating films.

In at least one of first main surface 1A and second main surface 1B, a surface roughness Ra is not more than 10 nm and a surface roughness Rz in each of rolling direction X and perpendicular direction Y is not more than 40 nm. That is, the one main surface of aluminum foil 1 has a surface smoothness higher than that of a conventional aluminum foil. Further, in the one main surface of aluminum foil 1, the number of peak counts determined from a roughness curve in at least one of rolling direction X and perpendicular direction Y is not less than 10 when a reference length L is 40 μm.

Surface roughness Ra of aluminum foil 1 is a value calculated by three-dimensionally expanding a center line average roughness Ra, which is defined in JIS B0601 (1982 Edition), in order to apply it to a surface. Moreover, surface roughness Rz of aluminum foil 1 in each of rolling direction X and perpendicular direction Y is a ten-point average roughness Rz defined in JIS B0601 (1982 Edition).

Figure 2:
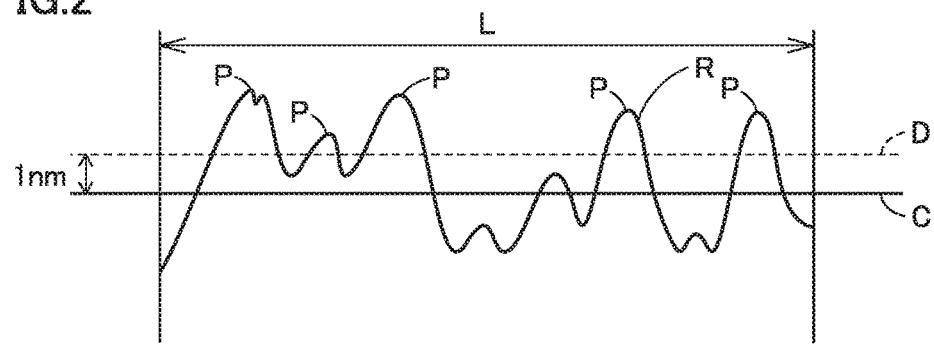
FIG. 2 illustrates the number of peak counts in the present embodiment.

Moreover, the number of peak counts based on the roughness curve is determined based on a roughness curve R of first main surface 1A or second main surface 1B obtained by an appropriate method as shown in FIG. 2. The number of peak counts refers to the number of peak counts per reference length L when one peak is represented by a peak P that projects upward relative to an upper peak count level D above a central line C of roughness curve R by 1 nm and provided in parallel with central line C and that has two points crossing peak count level D. Reference length L is 40 μm.

Roughness curve R can be obtained by observing first main surface 1A or second main surface 1B in accordance with a damping method (noncontact) using an atomic force microscope, for example. A region to be measured is in a visual field of 80 μm×80 μm, for example.

In aluminum foil 1, the number of peak counts based on the roughness curve of the one main surface in at least one of rolling direction X and perpendicular direction Y is not less than 10. Accordingly, when a mirror surface of a different member is brought into contact with the one main surface, the surface area of a portion of the one main surface in contact with the mirror surface can be small, even though surface roughnesses Ra, Rz are low as described above. As a result, the static friction coefficient and dynamic friction coefficient of the one main surface can be small.

Specifically, the static friction coefficient of the above-described one main surface of aluminum foil 1 according to the present embodiment is not more than 1.0. Moreover, in aluminum foil 1 according to the present embodiment, the dynamic friction coefficient of the one main surface is not more than 0.8. In a conventional aluminum foil in which the number of peak counts is small and at least one of the static friction coefficient and the dynamic friction coefficient is higher than the above-described value, it is difficult to sufficiently suppress a problem such as wrinkling or waviness from occurring due to contact with a roll when a roll-to-roll process is performed. Specifically, when an aluminum foil is brought into contact with a guide roll, a drive roll, or the like, uneven contact resistance is generated in the aluminum foil unless the entire contact surface of the aluminum foil comes into uniform contact with the roll in a direction in which the roll extends. On this occasion, extra tension acts on aluminum foil 1 in an unspecified direction. When the static friction coefficient and dynamic friction coefficient of the contact surface of the aluminum foil are large, the tension is more likely to cause a problem such as wrinkling or waviness in aluminum foil 1.

In contrast, the static friction coefficient and dynamic friction coefficient of the one main surface of aluminum foil 1 are lower than those of the conventional aluminum foil, i.e., the static friction coefficient is not more than 1.0 and the dynamic friction coefficient is not more than 0.8. Therefore, when the one main surface is employed as the contact surface with the roll in the roll-to-roll process, the uneven contact state between the one main surface and the roll is corrected by tension, thereby suppressing occurrence of the problem such as wrinkling or waviness in aluminum foil 1.

Further, aluminum foil 1 has the one main surface having a surface roughness Ra of not more than 10 nm. Therefore, by the roll-to-roll process or the like, a highly smooth functional coating film 4 with reduced thickness variation (see FIG. 5) can be formed on the one main surface and a film with a fine pattern in nanometer order can be formed thereon, for example.

Moreover, aluminum foil 1 has the one main surface in which surface roughness Rz is not more than 40 nm in each of rolling direction X and perpendicular direction Y. Therefore, even when a thin functional coating film 4 having a thickness of, for example, about 40 nm (see FIG. 5) is formed on the one main surface, an abnormal region (hereinafter, referred to as "lacking"), in which no functional coating film 4 is formed, can be suppressed from being formed on the one main surface.

Aluminum foil 1 preferably has a thickness T (see FIG. 1) of not less than 4 µm and not more than 200 µm. If the thickness of the aluminum foil is less than 4 µm, mechanical strength as the aluminum foil cannot be maintained, with the result that wrinkling is caused on the surface of the aluminum foil due to handling or the like during production. If the thickness of the aluminum foil is more than 200 µm, not only the weight of the aluminum foil is increased but also a process such as shaping is restricted, undesirably. Further preferably, the thickness of aluminum foil 1 is not less than 6 µm and not more than 200 µm.

It should be noted that aluminum foil 1 can be produced by performing a below-described method of producing the aluminum foil according to the present embodiment. The aluminum foil having surface roughnesses Ra, Rz above can be produced simply by a polishing method, such as physical polishing, electropolishing, or chemical polishing, or by a conventional cold rolling method. However, as a result of diligent study by the present inventors, it has not been confirmed that these polishing methods and conventional cold rolling method can be used to produce an aluminum foil 1 having a main surface in which the number of peak counts is not less than 10.

Next, with reference to FIG. 3, the following describes a method of producing the aluminum foil according to the present embodiment.

As shown in FIG. 3, as with a general method of producing an aluminum foil, the method of producing the aluminum foil according to the present embodiment includes: a step (S10) of preparing an ingot; a step (S20) of performing homogenization treatment to the ingot; a step (S30) of hot-rolling the ingot; a step (S40) of cold-rolling the hot-rolled member obtained by the hot rolling; and a step (S50) of forming an aluminum foil by cold-rolling the cold-rolled member obtained by the cold-rolling as final finishing (hereinafter, referred to as "final finishing cold rolling"). However, the method of producing the aluminum foil according to the present embodiment is different therefrom in that a reduction roll having a roll surface with a surface roughness Ra of not more than 40 nm is used in the final finishing cold rolling step (S50). Hereinafter, this will be specifically described.

First, an ingot is prepared (step (S10)). Specifically, a molten aluminum having a predetermined composition is prepared and is solidified to cast (for example, semi-continuously cast) an ingot.

Next, the obtained ingot is subjected to homogenization heat treatment (step (S20)). The homogenization heat treatment is performed, for example, under the following conditions: the heating temperature is not less than 400° C. and not more than 630° C.; and the heating time is not less than 1 hour and not more than 20 hours.

Next, the ingot is hot-rolled (step (S30)). Through this step, a hot-rolled member having a predetermined thickness W1 is obtained. The hot rolling may be performed once or multiple times.

Next, the hot-rolled member obtained by the hot rolling is cold-rolled (step (S40)). Through this step, a cold-rolled member (target member to be rolled in the final finishing cold rolling step (S50)) having a predetermined thickness W2 is obtained. In this step, for example, the cold rolling is performed multiple times with an intermediate annealing step being performed therebetween. For example, first, a first cold rolling step (S40A) is performed to the hot-rolled member, thereby forming a rolled member having a thickness thinner than thickness W1 of the hot-rolled member and thicker than thickness W2 of the cold-rolled member. Next, an intermediate annealing step (S40B) is performed onto the obtained rolled member. The intermediate annealing is performed, for example, under conditions that: the annealing temperature is not less than 50° C. and not more than 500° C.; and the annealing time is not less than 1 second and not more than 20 hours. Next, a second cold rolling step (S40C) is performed onto the rolled member having been annealed, thereby forming a cold-rolled member having a thickness W2.

Next, the cold-rolled member (target member) is subjected to the final finishing cold rolling (step (S50)). In this step, the target member is subjected to the final finishing cold rolling at a rolling reduction ratio of not less than 35% using a reduction roll having a surface roughness Ra of not more than 40 nm. The reduction roll has a roll surface to be in contact with and roll on the target member. If surface roughnesses Ra, Rz and the number of peak counts are not particularly restricted in the main surface (also referred to as "the other main surface") opposite to the one main surface of aluminum foil 1 obtained by this step (for example, if the other main surface is not in contact with the guide roll or the like when aluminum foil 1 is used in the roll-to-roll process), one of a pair of reduction rolls disposed with the target member interposed therebetween may have a roll surface with a surface roughness Ra of not more than 40 nm. On the other hand, each of the pair of reduction rolls has a roll surface with a surface roughness Ra of not more than 40 nm if aluminum foil 1 is formed to have first main surface 1A and second main surface 1B in each of which surface roughness Ra is not more than 10 nm, surface roughness Rz is not more than 40 nm in each of rolling direction X and perpendicular direction Y, and the number of peak counts based on the roughness curve in at least one of rolling direction X and perpendicular direction Y is not less than 10.

The reduction roll having a surface roughness Ra of not more than 40 nm is used in the final finishing cold rolling step due to the following reason. The surface roughness of the reduction roll used in the final finishing cold rolling step greatly affects the surface roughness of the aluminum foil obtained through the final finishing cold rolling step. When an aluminum foil is rolled using a reduction roll having a surface roughness Ra of more than 40 nm, a surface roughness Rz in perpendicular direction Y to rolling direction X becomes more than 40 nm in the obtained aluminum foil and a surface roughness Ra also become more than 10 nm therein. Surface roughness Ra of the reduction roll used in the final finishing cold rolling step is preferably as small as possible, and is more preferably not more than 30 nm. It should be noted that surface roughness Ra of the reduction roll is a center line average roughness Ra defined in JIS B0601 (1982 Edition), whereas surface roughness Ra of the aluminum foil is a value calculated by three-dimensionally expanding a center line average roughness Ra, which is defined in JIS B0601 (1982 Edition), in order to apply it to a surface.

The rolling reduction ratio is not less than 35% in the final finishing cold rolling step due to the following reason. Generally, when the rolling reduction ratio becomes low, an amount of rolling oil film to be introduced between the reduction roll and the aluminum foil tends to be increased. This leads to the increased number of oil pits each having a depth of several ten to several hundred nm and each obtained by the rolling oil being pushed into the surface of the aluminum foil having been through the rolling step. This results in increased irregularity in the surface of the obtained aluminum foil due to the oil pits. Therefore, when rolling is performed at a rolling reduction ratio of less than 35%, surface roughness Ra of the aluminum foil to be obtained is greatly affected by the irregularity resulting from the oil pits, and accordingly becomes more than 10 nm. The upper limit value of the rolling reduction ratio is not particularly limited, but is preferably 60% in consideration of rollability.

In this way, aluminum foil 1 according to the present embodiment can be obtained. In aluminum foil 1, at least one of first main surface 1A and second main surface 1B is a surface formed by rolling with a reduction roll having a surface roughness Ra of not more than 40 nm in the final finishing cold rolling step (S50).

It should be noted that in the cold rolling step (S40), the cold rolling may be performed only once. In the cold rolling step (S40), the cold rolling may be performed only before annealing and may not be performed after annealing. In other words, an intermediate annealing step may be performed between the cold rolling in the cold rolling step (S40) and the final finishing cold rolling in the next step (S50).

Moreover, the intermediate annealing may not be performed in the cold rolling step (S40). Moreover, in the cold rolling step (S40), the intermediate annealing may be performed after performing the cold rolling multiple times, or the cold rolling may be performed multiple times after the intermediate annealing.

Moreover, the target member to be subjected to the final finishing cold rolling in the final finishing cold rolling step (S50) is prepared by performing the hot rolling and cold rolling to the ingot; however, the target member may be prepared through continuous casting. Also in this case, aluminum foil 1 according to the present embodiment can be obtained by performing the final finishing cold rolling step (S50) to the target member.

A type of the rolling oil used for the final finishing cold rolling is not limited particularly, but it is more preferable that the rolling oil has a lower viscosity. This is due to the following reason. That is, since a lower viscosity of the rolling oil leads to higher lubrication of the rolling oil introduced between the reduction roll and the aluminum foil, the oil is less likely to be accumulated by the oil being pushed into the aluminum foil surface in the final finishing cold rolling step, thereby reducing the oil pits in the surface of the aluminum foil having been through the step. Preferably, the viscosity thereof when the oil temperature is 37.8° C. (100° F.) is not less than 1.7 cSt and not more than 3.5 cSt, and is more preferably not less than 2.0 cSt and not more than 3.0 cSt.

It should be noted that in order to produce a annealed aluminum foil 1, aluminum foil 1 obtained by the final finishing cold rolling step (S50) may be heated for about 1 to 30 hours at a temperature of about not less than 180° C. and not more than 450° C.

Next, with reference to FIG. 4, the following describes a roll-to-roll aluminum foil 3 that employs aluminum foil 1 obtained as described above.

As shown in FIG. 4, roll-to-roll aluminum foil 3 includes: aluminum foil 1 according to the present embodiment; and a core 2 around which aluminum foil 1 is wound in the form of a roll. Roll-to-roll aluminum foil 3 can be appropriately processed by the roll-to-roll process. In roll-to-roll aluminum foil 3, first main surface 1A of aluminum foil 1 is provided to serve as a contact surface with a guide roll or a drive roll when roll-to-roll aluminum foil 3 is used for the roll-to-roll process.

Figure 5:
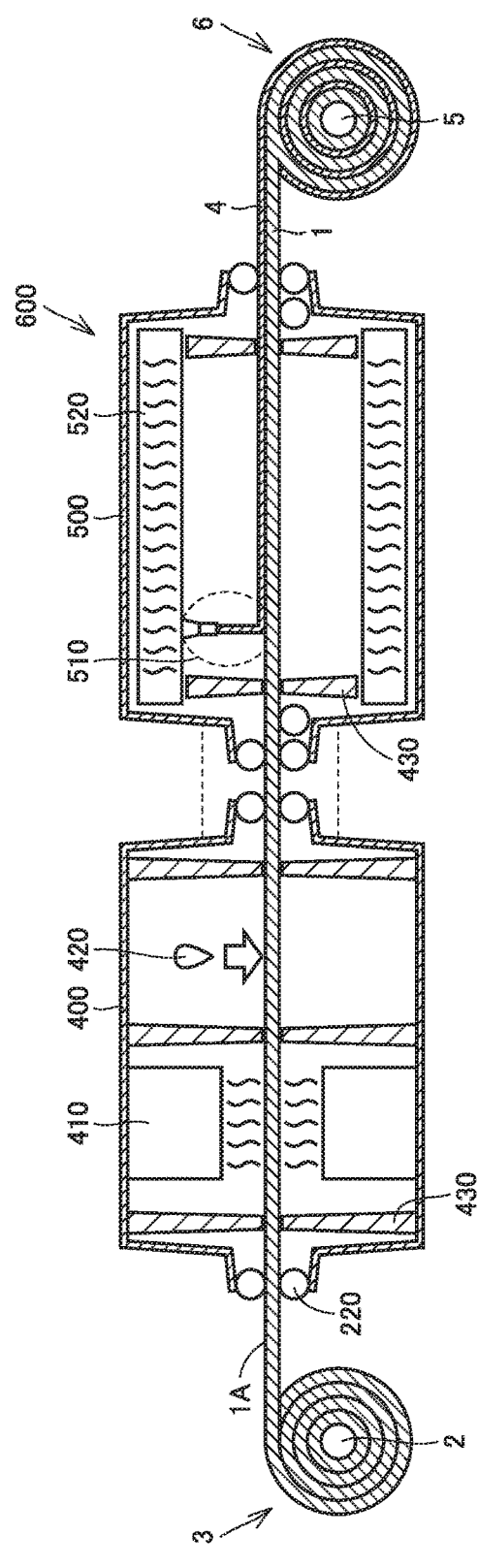
FIG. 5 is a cross sectional view for illustrating an example in which the roll-to-roll aluminum foil according to the present embodiment is used as a roll-to-roll carrier member.

With reference to FIG. 5, roll-to-roll aluminum foil 3 can be used as a roll-to-roll carrier member in a roll-to-roll type film forming apparatus 600, for example. Film forming apparatus 600 includes a pretreatment chamber 400 and a film forming chamber 500. In pretreatment chamber 400, a preheating apparatus 410 and an application unit 420 are accommodated with a separation wall 430 interposed therebetween, as required. Preheating apparatus 410 heats aluminum foil 1 to a predetermined temperature. Application unit 420 applies a release coating agent (such as a fluorine-based release coating agent or a silicone-based release coating agent) to first main surface 1A of aluminum foil 1. In film forming chamber 500, a spraying unit 510 and a heater 520 are accommodated. Spraying unit 510 sprays a raw material of functional coating film 4 to first main surface 1A of aluminum foil 1 serving as a carrier member. Heater 520 is configured to heat and harden the sprayed material. It should be noted that instead of spraying unit 510, film forming chamber 500 may be provided with: a discharging unit that discharges the raw material of functional coating film 4 to first main surface 1A; or an application unit that applies the raw material of functional coating film 4 to first main surface 1A.

In each of pretreatment chamber 400 and film forming, chamber 500, auxiliary rolls 220 are provided at inlet and outlet sides on a transportation path of aluminum foil 1 serving as a carrier member, so as to come in contact with and accordingly support first main surface 1A and second main surface 1B of aluminum foil L Hence, in roll-to-roll aluminum foil 3 used for film forming apparatus 600, aluminum foil 1 preferably has first main surface 1A and second main surface 1B in each of which: surface roughness Ra is not more than 10 urn; surface roughness Rz is not more than 40 nm in each of rolling direction X and perpendicular direction Y; and the number of peak counts based on the roughness curve in at least one of rolling direction X and perpendicular direction Y is not less than 10.

In this way, in each of first main surface 1A and second main surface 1B of aluminum foil 1, the static friction coefficient can be not more than 1.0 and the dynamic friction coefficient can be not more than 0.8. Accordingly, even when aluminum foil 1 comes into contact with auxiliary rolls 220 in the roll-to-roll process, occurrence of a problem such as wrinkling or waviness in aluminum foil 1 can be sufficiently suppressed.

As a result, by performing the roll-to-roll process using roll-to-roll aluminum foil 3, functional coating film 4 can be formed on first main surface 1A of aluminum foil 1. Accordingly, it is possible to readily produce, at a high yield, roll members 6 each including: aluminum foil 1; functional coating film 4 formed on first main surface 1A of aluminum foil 1; and a core 5 around which a layered body of aluminum foil 1 and functional coating film 4 is wound around in the form of a roll.

It should be noted that functional coating film 4 may be composed of any material, such as an appropriate metal or resin. In film forming chamber 500 of film forming apparatus 600, a plurality of application apparatuses (spraying units 510) capable of applying respective different materials are provided, and functional coating film 4 may be configured as a layered body of a plurality of functional coating layers. Functional coating film 4 configured as the layered body of the plurality of functional coating layers can be formed as a structure of at least a portion of a function element (function element 10 shown in FIG. 6) of any electronic device (for example, organic EL element 20 shown in FIG. 6).

In roll member 6, functional coating film 4 formed on first main surface 1A of aluminum foil 1 serving as a carrier member has a high smoothness and reduced thickness variation since surface roughness Ra of first main surface 1A is not more than 10 nm. Moreover, surface roughness Rz of first main surface 1A in each of rolling direction X and perpendicular direction Y is not more than 40 nm. Accordingly, for example, even when a thin functional coating film 4 of about 40 nm is formed on first main surface 1A, the above-described lacking in functional coating film 4 is suppressed in roll member 6. Moreover, roll-to-roll type film forming apparatus 600 is also capable of forming, on first main surface 1A of aluminum foil 1, a functional coating film having a fine pattern formed thereon. The spraying unit, discharging unit, or application unit of film forming chamber 500 is provided to be capable of spraying, discharging, applying onto a portion of first main surface 1A. Also in this way, in aluminum foil 1 serving as a carrier member, surface roughness Ra of first main surface 1A is not more than 10 nm, and surface roughness Rz of first main surface 1A in each of rolling direction X and perpendicular direction Y is not more than 40 nm. Accordingly, the functional coating film formed on first main surface 1A can have a pattern shape finer than that of a functional coating film formed on a conventional aluminum foil. A functional coating film having a pattern shape in, for example, nanometer order can be formed on first main surface 1A of aluminum foil 1 in accordance with the roll-to-roll method.

Figure 6:
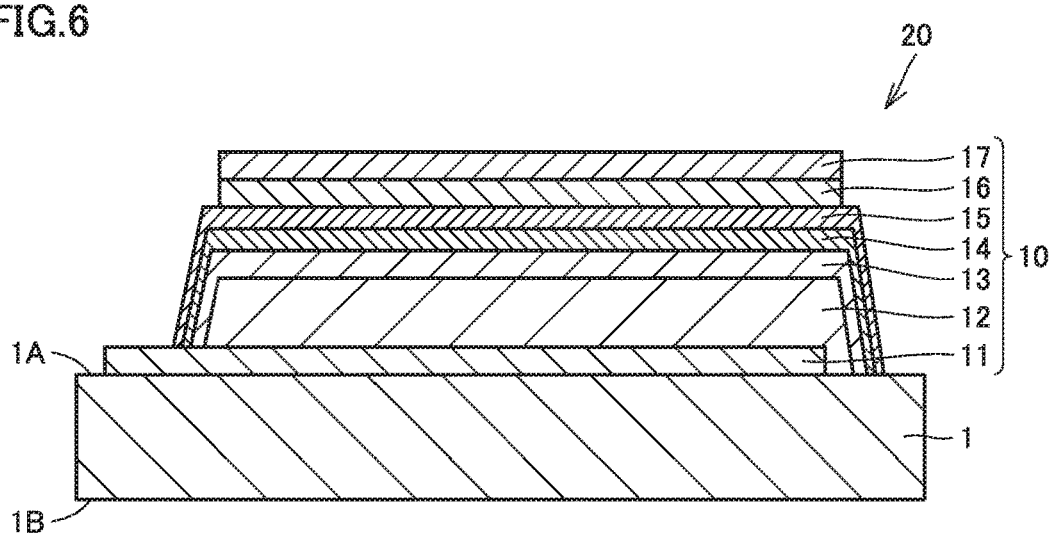
FIG. 6 is a cross sectional view for illustrating an organic EL element serving as an electronic device according to the present embodiment.
Figure 7:
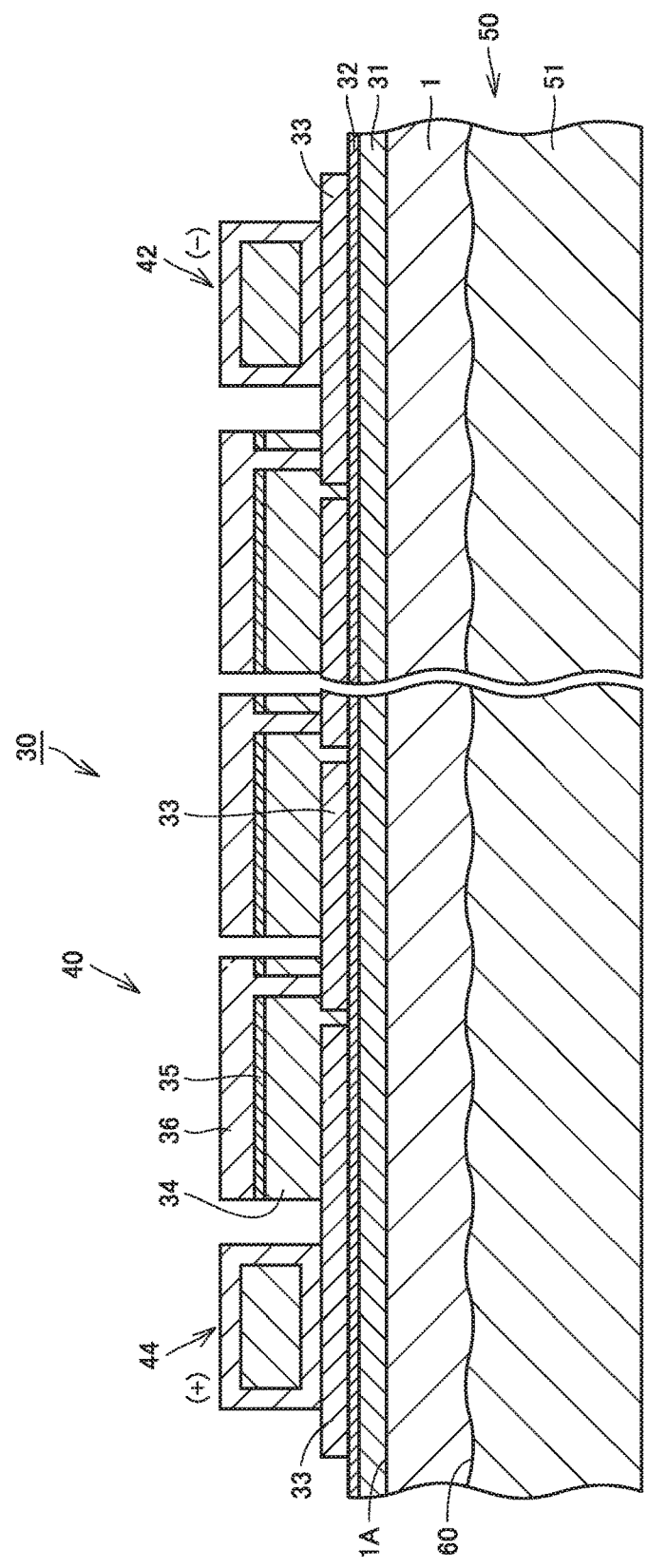
FIG. 7 is a cross sectional view for illustrating a solar cell serving as the electronic device according to the present embodiment.

Next, with reference to FIG. 6 and FIG. 7, the following describes an electronic device employing aluminum foil 1 obtained as described above.

As shown in FIG. 6, the electronic device according to the present embodiment includes: aluminum foil 1 according to the present embodiment; and an appropriate function element 10 formed on first main surface 1A of aluminum foil 1. FIG. 6 is a cross sectional view for illustrating an organic EL element 20 serving as the electronic device. FIG. 7 is a cross sectional view for illustrating a solar cell 30 serving as the electronic device.

Organic EL element 20 shown in FIG. 6 is produced by the roll-to-roll process using roll-to-roll aluminum foil 3 (or roll member 6) according to the present embodiment. Organic EL element 20 includes: a substrate 1 constituted of aluminum foil 1 in roll member 6; and a function element 10 constituted of functional coating film 4 formed on first main surface 1A of aluminum foil 1. Function element 10 has a configuration in which a lower electrode layer 11, a thick dielectric layer 12, a flattening layer 13, a light emitting layer 14, a thin dielectric layer 15, a buffer layer 16, and an upper transparent electrode layer 17 are layered on first main surface 1A of aluminum foil 1. Function element 10 is formed as functional coating film 4 by the roll-to-roll process using roll-to-roll aluminum foil 3 and film forming apparatus 600 as shown in FIG. 5.

Solar cell 30 shown in FIG. 7 is produced by the roll-to-roll process using roll-to-roll aluminum foil 3 according to the present embodiment. Solar cell 30 includes: a substrate 50 in which aluminum foil 1 in roll member 6 is bonded to a base member 51; and a function element (photovoltaic cell) 40 constituted of functional coating film 4 formed on first main surface 1A of aluminum foil 1. Function element 40 has a configuration in which an insulating layer 31, an alkali supplying layer 32, a lower electrode 33, a light absorption layer 34, a buffer layer 35, and an upper electrode 36 are layered on first main surface 1A of aluminum foil 1. Function element 40 is formed as functional coating film 4 by the roll-to-roll process using roll-to-roll aluminum foil 3 and film forming apparatus 600 as shown in FIG. 5. Photovoltaic cell 40 is provided to output power to outside via extraction electrodes 42, 44. Base member 51 may be composed of any metal such as titanium (Ti) or steel. Aluminum foil 1 and base member 51 are bonded to each other by a pressure bonding method using the roll-to-roll process, for example. In a bonding interface between aluminum foil 1 and base member 51, an alloy layer 60 may be formed.

In each of organic EL element 20 and solar cell 30, first main surface 1A and second main surface 1B of aluminum foil 1 serving as the substrate has a high surface smoothness as described above, thereby suppressing a problem such as wrinkling or waviness in the roll-to-roll process. Accordingly, decrease in yield due to the problem is suppressed.

Further, since light emitting layer 14 is formed on first main surface 1A having a high surface smoothness in organic EL element 20, the thickness variation of light emitting layer 14 is suppressed, whereby light emission variation due to current leakage or the like is suppressed in organic EL element 20. Moreover, in solar cell 30, since light absorption layer 34 is formed on first main surface 1A having a high surface smoothness, the thickness variation of light absorption layer 34 is suppressed, thereby suppressing variation in characteristics.

In other words, by performing the roll-to-roll process using roll-to-roll aluminum foil 3, function element 10, 40 can be formed on first main surface 1A of aluminum foil 1 at low cost and high yield, whereby an electronic device, such as organic EL element 20 or solar cell 30, including function element 10, 40 can be produced at low cost and high yield. In addition to these, aluminum foil 1 of the present invention can be used suitably for electronic devices, such as: displays such as a crystal liquid display and an electronic paper; an organic solar cell; a secondary battery; a semiconductor; and a touch panel.

It should be noted that the composition of aluminum foil 1 according to the present embodiment is not particularly limited; however, the content of iron (Fe) is preferably not less than 0.001 mass % and not more than 1.7 mass %. Since solid solubility of iron in aluminum is small, an intermetallic compound such as $FeAl_3$ is likely to be crystallized during casting of aluminum. A crystallized product on a surface (inclusive of first main surface 1A and second main surface 1B) of the aluminum foil causes irregularity in the surface. In the cold rolling step and final finishing cold rolling step of the method of producing the aluminum foil according to the present embodiment, aluminum is preferentially plastically deformed since the crystallized product is harder than the aluminum base. The crystallized product rolls on the surface of the aluminum foil plastically deformed and a part of the crystallized product falls off from the surface of the aluminum foil, thus causing irregularity in the surface of the aluminum foil. When the content of iron is not less than 1.7 mass %, a large amount of such a coarse crystallized product is deposited, with the result that it is difficult to control the surface smoothness of the aluminum foil. Moreover, when the content of iron is less than 0.001 mass %, the strength of the aluminum foil is decreased. Hence, the content of iron is preferably not less than 0.001 mass % and not more than 1.7 mass %.

Moreover, in aluminum foil 1 according to the present embodiment, the content of manganese (Mn) is preferably not more than 1.5 mass %. Since solid solubility of manganese in aluminum is also small as with iron, an Al—Fe—Mn based compound is likely to be crystallized during casting of aluminum. The Al—Fe—Mn based crystallized product is finer than an Al—Fe based crystallized product; however, these crystallized products fall off from the surface of the aluminum foil, thus causing irregularity in the surface of the aluminum foil. Therefore, the content of manganese needs to be not more than 1.5 mass %, and is preferably not more than 0.8 mass %.

Further, in aluminum foil 1 according to the present embodiment, the content of silicon (Si) is preferably not less than 0.001 mass % and not more than 0.6 mass %, and is more preferably not less than 0.001 mass % and not more than 0.3 mass %. Since solid solubility of silicon in aluminum is large and a crystallized product is therefore unlikely to be formed, silicon does not adversely affect the surface smoothness of the aluminum foil as long as the content of silicon in the aluminum foil is such that no crystallized product is generated. Moreover, the inclusion of silicon leads to solid solution strengthening, thereby improving mechanical strength of the aluminum foil. This facilitates rolling of a foil having a thin thickness. When the content of silicon is less than 0.001 mass %, the above-described effect cannot be sufficiently obtained. When the content of silicon is more than 0.6 mass %, the coarse crystallized product is likely to be generated to not only impede the surface smoothness but also hinder the effect of obtaining finer crystal grains, with the result that strength and workability also tend to be decreased.

In aluminum foil 1 according to the present embodiment, the content of magnesium (Mg) is preferably not more than 3 mass %. Since the solid solubility of magnesium in aluminum is large, i.e., 18 mass % at maximum and a crystallized product is very unlikely to be generated, the mechanical strength of the aluminum foil can be improved without greatly affecting the surface smoothness of the aluminum foil. However, when the content of magnesium is more than 3 mass %, the mechanical strength of the aluminum foil becomes too high, thereby decreasing rollability of the aluminum foil. In order to provide the aluminum foil with preferable reflective property and mechanical strength, the content of magnesium is further preferably not more than 2 mass %.

It should be noted that the aluminum foil of the present invention may contain element(s) such as copper (Cu), zinc (Zn), titanium (Ti), vanadium (V), nickel (Ni), chromium (Cr), zirconium (Zr), boron (B), gallium (Ga), and/or bismuth (Bi), as long as the above-described characteristics and effects are not affected. However, the content of each of these elements is preferably not more than 0.1 mass %.

As described above, aluminum foil 1 according to the present embodiment is literally a "foil", i.e., is different from an "aluminum plate" generally having a thickness of about not less than 500 μm, and has the following various advantages. Specifically, aluminum foil 1 is particularly excellent in its light weight, is readily shaped, and exhibits shape followability and flexibility, for example, can be adhered to a curved object, which is difficult for an aluminum plate, advantageously. Moreover, there is also an advantage over the aluminum plate in terms of environmental load, for example, an amount of waste can be reduced.

Therefore, due to the above-described advantages, such an aluminum foil 1 according to the present embodiment can be suitably used for, for example, the following applications: a base member (template member) for thin film production; a substrate for fine pattern formation; an electrode body (particularly, collector) of a secondary battery; a light reflecting member; a backseat for solar cells; an accessory; a building material; an electric appliance body; and an electronic device.

EXAMPLES

As described below, samples of aluminum foils of Examples of the present invention and Comparative Examples were produced.

Aluminums having compositions A to H shown in Table 1 were used to produce, in accordance with production steps shown in Table 2, samples of aluminum foils of Examples 1 to 13 and Comparative Examples 1 to 4 shown in Table 3. It should be noted that "Total of Other Elements" in Table 1 indicates a total content of inevitable impurity elements (B, Bi, Pb, Na, and the like) other than the elements defined in JIS.

TABLE 1

| Alloy | Si (Mass %) | Fe (Mass %) | Mn (Mass %) | Cu (Mass %) | Mg (Mass %) | Zn (Mass %) | Total of Other Elements (Mass %) |
|---|---|---|---|---|---|---|---|
| A | 0.002 | 0.002 | 0.001 | 0.006 | 0.000 | 0.001 | 0.00 |
| B | 0.020 | 0.056 | 0.001 | 0.001 | 0.000 | 0.003 | 0.02 |
| C | 0.150 | 0.460 | 0.000 | 0.020 | 0.001 | 0.000 | 0.00 |
| D | 0.243 | 0.579 | 1.196 | 0.142 | 0.001 | 0.003 | 0.15 |
| E | 0.001 | 0.001 | 0.780 | 0.001 | 0.000 | 0.000 | 0.00 |
| F | 0.024 | 0.050 | 1.100 | 0.002 | 0.000 | 0.000 | 0.00 |
| G | 0.241 | 0.416 | 1.090 | 0.145 | 1.161 | 0.050 | 0.15 |
| H | 0.102 | 0.286 | 0.017 | 0.020 | 2.469 | 0.012 | 0.37 |

TABLE 2

| Alloy | Examples, Comparative Examples | 1. Homogenization Heat Treatment | 2. Hot Rolling | 3. Cold Rolling | 4. Intermediate Annealing | 5. Cold Rolling |
|---|---|---|---|---|---|---|
| A | Examples 1, 2, 3, 4 and Comparative Example 1 | 450° C.; 1 Hour | Performed | Performed | — | Performed |
|   | Example 8 | — | — | — |   |   |

TABLE 2-continued

| Alloy | Examples, Comparative Examples | 1. Homogenization Heat Treatment | 2. Hot Rolling | 3. Cold Rolling | 4. Intermediate Annealing | 5. Cold Rolling |
|---|---|---|---|---|---|---|
| B | Example 5 | 450° C.; 1 Hour | Performed | | | |
|   | Example 9 | — | — | | | |
| C | Example 6 | 590° C.; 1 Hour | Performed | | 450° C.; 3 Hours | |
|   | Comparative Examples 2, 3, 4 | 530° C.; 1 Hour | | | 330° C.; 3 Hours | |
| D | Example 10 | — | — | | — | |
| E | Example 7 | 590° C.; 1 Hour | Performed | | | |
| F | Example 11 | — | — | | | |
| G | Example 12 | | | | | |
| H | Example 13 | | | | | |

The samples of the aluminum foils of Examples 1 to 13 were produced mainly in two manners. As with the method of producing the aluminum foil according to the present embodiment, each of the samples of the aluminum foils oF Examples 1 to 7 was produced by performing homogenization heat treatment and hot-rolling to an aluminum alloy (ingot), and then performing cold rolling and final finishing cold rolling (production method 1).

Specifically, an aluminum ingot obtained by DC casting was subjected to homogenization heat treatment in a heating furnace at a predetermined temperature for a predetermined time. Then, the ingot was hot-rolled until the thickness thereof became about 6.5 mm. The obtained hot-rolled member was cold-rolled multiple times. Between the cold rollings, intermediate annealing was performed at a predetermined temperature for a predetermined time, and then cold rolling was further performed, thereby producing a target member having a predetermined thickness. Furthermore, the target member was subjected to final finishing cold rolling. Table 2 shows respective process conditions. In this way, the samples of the aluminum foils of Examples 1 to 7 having the respective thicknesses shown in Table 3 were produced.

The samples of the aluminum foils of Examples 8 to 13 were produced by performing continuous casting, then directly performing cold rolling to the obtained ingot, and performing final finishing cold rolling (production method 2).

Specifically, an aluminum ingot obtained by continuous casting was subjected to cold rolling multiple times, thereby producing a target member having a predetermined thickness. Further, the target member was subjected to the final finishing cold rolling. Table 2 shows respective process conditions. In this way, the samples of the aluminum foils of Examples 8 to 13 having the respective thicknesses shown in Table 3 were produced.

Each of the samples of the aluminum foils of Examples 1 to 13 were produced by performing the final finishing cold rolling to the target member at a rolling reduction ratio of 35% using a reduction roll having a surface roughness Ra of 40 nm.

The sample of the aluminum foil of Comparative Example 1 was produced by: performing homogenization heat treatment and hot rolling to the ingot; performing cold rolling; performing cold rolling under the same conditions as those of the final finishing cold rolling in the method of producing the aluminum foil according to the present embodiment; and electropolishing the obtained aluminum foil. That is, the final cold rolling before the electropolishing was performed at a rolling reduction ratio of 35% using a reduction roll having a surface roughness Ra of 40 nm. The electropolishing was performed by immersing, under a voltage of 20 V for 3 minutes, this aluminum foil in a solution having a bath temperature of 0° C. and including 400 mL of ethanol and 100 mL of perchloric acid.

The sample of the aluminum foil of Comparative Example 2 was produced by basically the same method as that for the sample of the aluminum foil of Comparative Example 1, but intermediate annealing was performed between cold rollings at a predetermined temperature for a predetermined time and the final cold rolling before the electropolishing was performed at a different rolling reduction ratio. Specifically, the final cold rolling was performed at a rolling reduction ratio of 33% using a reduction roll having a surface roughness Ra of 40 nm.

The sample of the aluminum foil of Comparative Example 3 was produced by performing homogenization heat treatment and hot rolling to an ingot, and then performing cold rolling and final finishing cold rolling. The final finishing cold rolling was performed at a rolling reduction ratio of 35% using a reduction roll having a surface roughness Ra of 1500 nm.

The sample of the aluminum foil of Comparative Example 4 was produced by performing homogenization heat treatment and hot rolling to an ingot, and then performing cold rolling and final finishing cold rolling. The final finishing cold rolling was performed at a rolling reduction ratio of 44% using a reduction roll having a surface roughness Ra of 1500 nm.

It should be noted that time for the homogenization heat treatment may be within a general process time and is not limited to the time shown in Table 2. The conditions for the intermediate annealing are not limited to the temperatures and time shown in Table 2, and may fall within a range of general operation conditions.

Regarding each of the obtained samples of Examples 1 to 13 and Comparative Examples 1 to 4, its main surface located to have faced the reduction roll having a controlled surface roughness Ra was observed using an atomic force microscope. Based on the result of observation, surface roughness Ra, the value of surface roughness Rz in each of rolling direction X and perpendicular direction Y to rolling direction X, and the number of peak counts were measured. Further, the static friction coefficient and dynamic friction coefficient of the main surface of each sample were measured. Hereinafter, details of these measurement methods will be described.

The observation using the atomic force microscope was performed as follows: a scanning type probe microscopy, Nanopics1000, provided by Seiko Instruments, Inc., was used to observe a surface shape in accordance with a damping method (noncontact) in a rectangular visual field of 80 μm×80 μm. The inclination of the sample was corrected through three-dimension curve automatic inclination correction in which a curve was found for the obtained result of observation through least square approximation and fitting was performed, and surface roughness Ra and surface roughness Rz in each of rolling direction X and perpendicular direction Y to rolling direction X was measured. Surface roughness Ra is a value calculated by three-dimensionally expanding a center line average roughness Ra, which is defined in JIS B0601 (1982 Edition), in order to apply it to the entire observed surface. Surface roughness Rz in each of rolling direction X and perpendicular direction Y was measured by measuring, in accordance with an evaluation method based on JIS B0601 (1982 Edition), an Rz value in two dimensions at an arbitrary cross section along each of the rolling direction and perpendicular direction Y within the same visual field.

The number of peak counts in each of rolling direction X and perpendicular direction Y was measured as follows. First, the roughness curve of the main surface at an arbitrary cross section along each of rolling direction X and perpendicular direction Y within the same visual field was obtained. Next, for this roughness curve, a central line and an upper peak count level were provided. The upper peak count level was above the central line by 1 nm and was in parallel with the central line. Then, the number of peaks in reference length L was counted under conditions that reference length L is 40 μm and one peak is represented by a portion that has two points crossing the upper peak count level in the roughness curve, that has no other crossing point between the two points, and that projects upward relative to the upper peak count level.

The static friction coefficient and dynamic friction coefficient were evaluated using a frictional force measuring instrument provided by Sagawa Manufacturing, Inc. First, a SUS plate weight having a weight of 200 g, having an area of 65 mm×65 mm, and having a mirror surface was placed on the main surface of each of the samples of Examples 1 to 13 and Comparative Examples 1 to 4. Then, the SUS plate weight was slid by 20 mm in parallel with the rolling direction at a speed of 100 mm/min. In doing so, the static friction coefficient was measured based on force required to start moving the SUS plate weight (force added to the SUS plate weight). Further, the dynamic friction coefficient was measured based on an average value of force required to move, after the SUS plate weight started to move, at the above-described speed in an interval between 15 mm and 20 mm from the position at which the SUS plate weight started moving (force added to the SUS plate weight).

Table 3 shows the measurement values of surface roughnesses Ra, Rz, the number of peak counts, the static friction coefficient, and the dynamic friction coefficient in each of the samples.

TABLE 3

| Examples | Alloy | Thickness (μm) | Surface Ra (nm) | Perpendicular to Rolling Direction | | Rolling Direction | | Friction Coefficient | |
|---|---|---|---|---|---|---|---|---|---|
| | | | | Rz (nm) | Pc | Rz (nm) | Pc | Static | Dynamic |
| Example 1 | A | 80 | 3.1 | 13.2 | 11.0 | 10.0 | 9.4 | 0.68 | 0.51 |
| Example 2 | A | 30 | 5.7 | 28.7 | 12.3 | 21.8 | 7.1 | 0.82 | 0.56 |
| Example 3 | A | 60 | 7.5 | 39.6 | 12.4 | 28.8 | 6.6 | 0.82 | 0.38 |
| Example 4 | A | 100 | 6.6 | 32.3 | 14.0 | 14.7 | 6.8 | 0.67 | 0.50 |
| Example 5 | B | 30 | 6.3 | 33.4 | 13.2 | 29.8 | 6.4 | 0.81 | 0.51 |
| Example 6 | C | 30 | 8.5 | 38.7 | 12.6 | 31.6 | 7.8 | 0.85 | 0.58 |
| Example 7 | E | 150 | 1.6 | 8.6 | 13.0 | 6.6 | 12.8 | 0.72 | 0.49 |
| Example 8 | A | 150 | 2.2 | 11.9 | 17.6 | 12.4 | 10.4 | 0.76 | 0.49 |
| Example 9 | B | 150 | 2.4 | 10.0 | 15.8 | 10.8 | 8.8 | 0.78 | 0.49 |
| Example 10 | D | 150 | 4.0 | 17.0 | 12.0 | 22.8 | 6.2 | 0.69 | 0.27 |
| Example 11 | F | 150 | 2.9 | 13.4 | 17.0 | 11.7 | 9.2 | 0.75 | 0.33 |
| Example 12 | G | 150 | 6.8 | 31.2 | 7.4 | 36.0 | 11.4 | 0.74 | 0.23 |
| Example 13 | H | 150 | 6.8 | 38.8 | 6.2 | 38.7 | 11.4 | 0.70 | 0.23 |
| Comparative Example 1 | A | 60 | 6.8 | 11.6 | 2.4 | 13.1 | 2.8 | 1.05 | 0.59 |
| Comparative Example 2 | C | 40 | 9.1 | 11.9 | 1.2 | 22.3 | 7.6 | 1.10 | 0.55 |
| Comparative Example 3 | C | 20 | 39.4 | 133.6 | 5.4 | 65.0 | 8.0 | 0.64 | 0.82 |
| Comparative Example 4 | C | 50 | 15.5 | 58.8 | 8.0 | 37.4 | 5.8 | 0.82 | 0.84 |

From the result shown in Table 3, it was found that: each of the samples of Examples 1 to 13, each obtained by performing the final finishing cold rolling to the target member at a rolling reduction ratio of not less than 35% using the reduction roll having a surface roughness Ra of not more than 40 nm, has a surface in which surface roughness Ra is not more than 10 nm and surface roughness Rz is not more than 40 nm in each of the rolling direction and the direction perpendicular to the rolling direction; and the number of peak counts determined from the roughness curve of the main surface in at least one of the rolling direction and the perpendicular direction was not less than 10 when reference length L was 40 μm. Furthermore, in each of the samples of Examples 1 to 13, the static friction coefficient was not more than 1.0 and the dynamic friction coefficient was not more than 0.8.

On the other hand, the number of peak counts in each of the rolling direction and the perpendicular direction was less than 10 and the static friction coefficient was more than 1.0 in each of the samples of Comparative Example 1 and Comparative Example 2 each produced by performing electropolishing after cold-rolling the target member at a rolling reduction ratio of 35% or 33% using the reduction roll having a surface roughness Ra of not more than 40 nm.

Moreover, in the samples of Comparative Examples 3 and 4 produced by performing the final finishing cold rolling using the reduction roll having a surface roughness Ra of 1500 nm, surface roughness Ra was more than 10 nm, surface roughness Rz in the direction perpendicular to the rolling direction was more than 40 nm, and the number of peak counts in each of the rolling direction and the perpendicular direction was less than 10. In each of the samples of Comparative Examples 3 and 4, the dynamic friction coefficient was more than 0.8.

From the result above, it was confirmed that according to the present invention, an aluminum foil can be obtained which has sufficiently low static friction coefficient and dynamic friction coefficient as compared with a conventional aluminum foil. Accordingly, it was confirmed that in the aluminum foil according to the present invention, occurrence of wrinkling or waviness can be suppressed during a roll-to-roll process.

The embodiments and experiment examples disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

The present invention is particularly advantageously applied to an aluminum foil used for a roll-to-roll process.

REFERENCE SIGNS LIST

1: aluminum foil; 1A: first main surface; 1B: second main surface; 2, 5: core; 3: roll-to-roll aluminum foil; 4: functional coating film; 6: roll member; 10, 40: function element; 11: lower electrode layer; 12: thick film dielectric layer; 13: flattening layer; 14: light emitting layer; 15: thin film dielectric layer; 16: buffer layer; 17: upper transparent electrode layer; 20: organic EL element; 30: solar cell; 31: insulating layer; 32: alkali supplying layer; 33: lower electrode; 34: light absorption layer; 35: buffer layer; 36: upper electrode; 42, 44: extracting electrode; 51: base member; 60: alloy layer; 220: auxiliary roll; 400: pretreatment chamber; 410: preheating apparatus; 420: application unit; 430: separation wall; 500: film forming chamber; 510: spraying unit; 520: heater; 600: film forming apparatus.

The invention claimed is:

1. An aluminum foil comprising a first main surface and a second main surface located opposite to the first main surface,
in at least one of the first main surface and the second main surface, a surface roughness Ra being not more than 10 nm, a surface roughness Rz being not more than 40 nm in each of a rolling direction and a direction perpendicular to the rolling direction, the number of peak counts being not less than 10 when a reference length L is 40 µm, the number of peak counts being determined from a roughness curve in at least one of the rolling direction and the direction perpendicular to the rolling direction.

2. The aluminum foil according to claim 1, wherein a static friction coefficient is not more than 1.0 in the at least one of the first main surface and the second main surface.

3. The aluminum foil according to claim 1, wherein a dynamic friction coefficient is not more than 0.8 in the at least one of the first main surface and the second main surface.

4. The aluminum foil according to claim 1, wherein the aluminum foil has a thickness of not less than 4 µm and not more than 200 µm.

5. An electronic device comprising:
the aluminum foil recited in claim 1; and
a function element formed on the aluminum foil.

6. A roll-to-roll aluminum foil comprising:
the aluminum foil recited in claim 1; and
a core around which the aluminum foil is wound in the form of a roll.

7. A method of producing the aluminum foil recited in claim 1, the method comprising forming the aluminum foil by performing final finishing cold rolling to a target member at a rolling reduction ratio of not less than 35% using a reduction roll having a surface roughness Ra of not more than 40 nm.

* * * * *